United States Patent [19]

Liken et al.

[11] Patent Number: 5,268,637
[45] Date of Patent: Dec. 7, 1993

[54] CARRIER FOR TESTING CIRCUIT BOARDS

[75] Inventors: Peter A. Liken, West Olive; Robert J. Holmes, Grand Rapids, both of Mich.

[73] Assignee: Venturedyne, Ltd., Milwaukee, Wis.

[21] Appl. No.: 4,668

[22] Filed: Jan. 14, 1993

Related U.S. Application Data

[63] Continuation of Ser. No. 808,365, Dec. 16, 1991, abandoned.

[51] Int. Cl.$^5$ .................. G01R 31/02; H05K 7/14
[52] U.S. Cl. .................. 324/158 F; 324/537; 361/692; 361/796
[58] Field of Search .................. 324/158 F, 73.1, 501, 324/537; 219/209; 361/390, 415; 211/41; 439/152

[56] References Cited

U.S. PATENT DOCUMENTS

| | | | |
|---|---|---|---|
| 3,271,626 | 9/1966 | Howrilka | 439/152 |
| 4,145,620 | 3/1979 | Dice | 324/501 |
| 4,158,876 | 6/1979 | Pedro | 361/415 |
| 4,184,599 | 1/1980 | Drake et al. | 361/415 |
| 4,382,517 | 5/1983 | Welsch | 361/415 |
| 4,636,726 | 1/1987 | Santomango et al. | 324/158 F |
| 4,683,424 | 7/1987 | Cutright et al. | 324/158 F |
| 4,746,015 | 5/1988 | Kaucic | 361/415 |
| 4,986,778 | 1/1991 | Liken et al. | 439/74 |
| 5,003,156 | 3/1991 | Kilpatrick et al. | 219/209 |

OTHER PUBLICATIONS

Environmental Engineering—Journal of the Society of Environmental Engineers; vol. 4, No. 2; Jun., 1991.
Ransco Product Bulletins.
Sexton Espec Product Bulletin.
Aerotronic Associates, Inc. Product Bullentins.

Primary Examiner—Ernest F. Karlsen
Attorney, Agent, or Firm—Jansson & Shupe, Ltd.

[57] ABSTRACT

The invention is an improvement in a carrier of the type used for testing circuit boards in an environmental test chamber. The improvement includes a plurality of frame-supported, spaced-apart shelves. Pairs of shelves are used to hold circuit boards being tested. The position of at least one shelf in such a pair is adjustable to select the proper dimension to support circuit boards of any of several particular sizes. In a highly preferred arrangement, shelves are arranged in two groups. At least one of the two or more shelves in each group is adjustable so that the carrier simultaneously accommodates circuit boards of differing sizes for test. Arrangements are shown whereby circuit boards of varying heights and/or lengths can be mounted in the carrier for simultaneous testing.

15 Claims, 9 Drawing Sheets

000
CARRIER FOR TESTING CIRCUIT BOARDS

RELATED APPLICATION

This application is a continuation of application Ser. No. 07/808,365 filed on Dec. 16, 1991, and now abandoned.

FIELD OF THE INVENTION

This invention relates generally to environmental chambers for testing electrical circuit boards and, more particularly, to a chamber-inserted carrier for holding multiple circuit boards to be tested.

BACKGROUND OF THE INVENTION

Most types of electronic equipment, e.g., TV sets, aircraft navigation devices and the like, incorporate circuit boards made of a thin, flat dielectric sheet. The sheet has resistors, capacitors, integrated circuits and other components mounted on it. While some boards are "hard-wired" using conventional soldered wiring, printed circuit boards (or "PC boards") are more common. Such PC boards employ flat foil strips (applied by a process akin to printing) as the "wiring" for component interconnection.

Many applications for circuit boards involve hostile operating environments particularly including temperature extremes and, sometimes, rapid excursions between such extremes. Unless recognized in board construction and testing, such environments can cause premature failure of the board per se and/or of the components mounted thereon. For example, radios used in mobile equipment such as military vehicles often experience extremes of heat and cold. And aircraft electronic gear similarly experiences such extremes—but over a much shorter time span. For example, a military aircraft may be at summer desert temperatures and at subzero temperature at high altitude only a few minutes later.

To help assure that circuit boards provide the requisite degree of reliability in such applications, board manufacturers often subject them to temperature tests by placing them within environmental chambers capable of producing rapid and extreme changes in temperature. For example, such a chamber might provide a temperature change of from −40° F. to over 200° F. in about 30 minutes. A prominent designer and manufacturer of such environmental test chambers is Thermotron Industries, Inc., of Holland, Mich.

A significant concern of circuit board manufacturers is the ability to test large quantities of boards economically. Testing of several hundred circuit boards per working shift is not unusual. Where such boards fill a high production requirement such as for passenger automobiles, circuit board test facilities are absolutely required to keep pace with the demands of modern, rapid production. Clearly, the environmental test chamber and its companion chamber-inserted carrier must avoid "bottle-necking" the production process. Until the invention, efforts to avoid such delay have not been uniformly successful.

The ability to quickly test large quantities of circuit boards involves at least two primary factors, namely, (a) the size, in BTU capacity, of chamber heating and refrigeration units and (b) the ability to quickly load the carrier with boards to be tested and unload such boards after testing is complete.

The ability to achieve the latter is significantly impaired if the same carrier is used to test circuit boards of differing sizes (e.g., length and/or height) or if different mother boards are required to interface the circuit boards with the test instruments. The invention is related to carrier configuration and uniquely resolves problems attending test of circuit boards including boards of disparate types.

One type of known carrier system is simply a cart on which the test chamber user places pallets containing products to be tested. The pallet-bearing cart is rolled into the chamber by a transport vehicle resembling a small lift truck. After the cart is "spotted" in the chamber, the vehicle is withdrawn and the chamber doors closed. In a variation of this arrangement, the cart incorporates an integral door so that when the cart is properly positioned, the door is automatically placed for latching closed. Such arrangements have significant "mass" embodied in the amount of steel and other materials used in its construction. Unnecessary mass acts as a heat absorber and can require that a test chamber have larger heating and refrigeration units to provide specified temperature excursions within a limited time.

Another type of "carrier" involves multiple drawers individually inserted into racks. Each drawer is loaded with circuit boards hooked to one or more common connectors by "pigtail" cables. Drawers are connected to external instrumentation by multi-plug back plane connectors. An arrangement of this type is shown in *Environmental Engineering* magazine, issue of June, 1991.

Other types of carriers are shown in U.S. Pat. Nos. 4,683,424 (Cutright et al.) and 4,986,778 (Liken et al.). The carrier shown in the Cutright et al. patent uses a frame in which multiple pull-out drawers are mounted. The arrangement somewhat resembles a multi-drawer file cabinet. Drawers are withdrawn, loaded with individual circuit boards plugged to a mother board and thereupon re-inserted in the frame. When the drawer is fully inserted, an electrical plug at the rear of the drawer connects with a stationary back plane plug at the rear of the drawer compartment.

The carrier shown in the Liken et al. patent involves a relatively thin frame-like structure having four openings into which may be fitted individual circuit boards for test. Structures are made with different openings and circuit board mounting brackets to accommodate boards of different sizes. In turn, the frames are inserted in parallel, spaced relationship into a larger carrier-like rack.

Generally stated, known carriers have a fixed number of non-movable shelves, mother boards mounted in a predetermined part of the carrier and are made of pieces of stainless steel tubing welded together. Such carriers are configured to test a predetermined number of circuit boards of a specific size or sizes.

Notwithstanding the above-described carrier arrangements and their general acceptability to users of environmental chambers, there is a significant need for a carrier which can be readily adapted to a variety of circuit board types and sizes. A carrier having such a capability and having a low mass for reduced thermal loading of heating and refrigeration units would be an important advance in the art.

OBJECTS OF THE INVENTION

It is an object of the invention to overcome some of the problems and shortcomings of the prior art.

Another object of the invention is to provide an improved circuit board carrier which can be quickly adapted to test circuit boards of differing types, e.g., incorporating different electrical circuits.

Still another object of the invention is to provide an improved circuit board carrier which can be quickly adapted to test circuit boards of differing physical sizes including differing height and/or length.

Another object of the invention is to provide an improved circuit board carrier which permits insertion and removal of circuit boards from more than one side of the carrier.

Yet another object of the invention is to provide an improved circuit board carrier which has an open, non-obstructive and non-obstructed interior.

Another object of the invention is to provide an improved circuit board carrier which presents a lower-mass and, therefore, reduced thermal load to test chamber heating and refrigeration equipment. How these and other objects are accomplished will become more apparent from the following detailed description taken in conjunction with the drawing.

SUMMARY OF THE INVENTION

The invention is an improvement in a carrier used for testing circuit boards, including printed circuit boards, in a thermal test chamber. When using such a chamber, the carrier (with its "cargo" of circuit boards) is placed into the chamber and the door closed. The carrier is of the type having a frame and plural locations for mounting circuit boards during test.

The improvement comprises a plurality of frame-supported shelves spaced apart from one another by a dimension. The position of at least one shelf is adjustable with respect to the other shelf to select the proper dimension for particular circuit boards having a common dimension, e.g., the same height. Boards are supported on edge between shelves and shelf adjustability permits the carrier to accommodate circuit boards of differing sizes for test. For example, the chamber may be used to test boards having a common dimension of, say, 12 inches. The next batch of boards may have a common dimension of 9.5 inches. By shelf adjustment, boards of either size (and of many other sizes) can be readily mounted for test.

In one highly preferred embodiment, the improved carrier has shelves arranged in at least two groups or "stacks" of vertically arranged shelves. And, of course, the shelve(s) making up each group may, with modifications to the chamber air flow arrangement, be oriented horizontally.

Preferably, each group has at least two shelves and the groups are side by side. The position of at least one shelf in each group is adjustable for selection of the dimension between shelves. Since a shelf in each group can be so adjusted with respect to another shelf in the same group, the carrier simultaneously accommodates circuit boards of differing sizes, one size in each group.

However, the improved carrier need not have groups of shelves to accommodate circuit boards of differing sizes. In another embodiment, the carrier has at least three shelves, e.g., one above the other. Two of the shelves are adjustable to select the dimension between pairs of shelves. That is, the dimension between shelves "1" and "2," for example, can be selected to be different from that between shelves "2" and "3." Such is another way by which the carrier simultaneously accommodates circuit boards of differing sizes. But that is not all.

Yet another preferred embodiment is described in connection with what is commonly known as a "mother board." And the embodiment will more easily be appreciated after a brief explanation regarding the function of mother boards.

A mother board is a generally flat board having printed or "hard" wiring and multiple plugs. Multiple circuit boards are temporarily connected during testing to the multiple plugs of a single mother board. Often, such connection is of the rigid plug and socket type although small "pigtail" cables can be used. Insofar as is now known, existing types of mother boards are securely attached to (and may be an integral part of) the related structure. Such mother boards are not readily removed. While the derivation of the term "mother board" is uncertain, the arrangement is not unlike a mammalian female animal simultaneously nursing several offspring.

In turn, the mother board has a flexible connector cable used as described below or such board may be constructed to plug into a main test bus. A function of the mother board is to provide part of the connecting "interface" between the circuit boards under test and the instruments located outside the chamber. Mother boards are constructed to be used with a particular circuit board or, at most, only a few different circuit boards. Therefore, mother boards of a particular type are left in place on the carrier until completion of testing of compatible circuit boards.

In another preferred embodiment, the carrier shelves are arranged in at least two groups, one of which has at least two shelves and the other of which has at least three shelves. Separate mother boards are mounted on and extend between the shelves of the two-shelf group and between two adjacent shelves of the three-shelf group. When the mother boards are mounted at differing elevations and, as to each group, upon differing shelf edges (interior or exterior), the carrier simultaneously accommodates circuit boards of differing sizes. In this instance, the size is circuit board length. Putting it another way, some circuit boards have a length generally equal to the width of a shelf while the length of others is generally equal to the width of two shelves and the between-shelf space. And it is to be appreciated that in this embodiment, no shelf adjustment or modification need be made to accommodate such different board sizes.

The utility and flexibility of the carrier is materially enhanced if the position of at least some of the shelves is adjustable. Accordingly, the improved carrier also includes shelf retention mechanisms, preferably of the pin-and-slot type. A clamp knob tightens or releases to, respectively, retain or adjust shelf position. A pin-and-slot mechanism (or one having similar characteristics) is preferred since it is adjustable along a continuum rather than in less-flexible discrete increments.

Preferred mother board attachment is by constructing each shelf (or at least two adjacent shelves) with interior and exterior edges. A mother board is releasably attached to and extends between corresponding adjacent shelf edges. Attachment is by fasteners and a mother board is thereby firmly supported between such shelves and can be quickly detached from such halves. With rectangular mother boards (the typical configuration), preferred attachment is along two parallel board edges, e.g., top and bottom edges.

Where a shelf (an intermediate shelf) is between two other shelves, such shelf includes an edge for releasably attaching a pair of oppositely-extending (e.g., up and down) mother boards to the edge. A shelf so constructed does "double duty" and the number of shelves required for mother board mounting is minimized.

In another aspect of the invention, the carrier frame is referred to as a "perimeter" frame in that all its structural members are generally coincident with the outer boundaries of the spatial "envelope" defined by the frame. In other terms, the frame has a substantially open interior. The attaching edges of the shelves (an edge to which a mother board may be attached) are interior of the frame rather than near or at its outer boundary. Therefore, the mother boards create no obstruction and circuit boards are readily inserted between shelves.

In a related aspect, one arrangement of an improved carrier has shelves arranged in two groups, each having at least two shelves. Each shelf has an exterior edge and also has an interior edge attached to a mother board. The frame and the exterior edges of shelves in a group define an opening whereby circuit boards are inserted to and removed from either or both of two carrier sides. For a relatively specific shelf and carrier configuration, the shelf interior and exterior edges are generally parallel to one another and to those of other shelves. In that way, circuit boards can be inserted to and removed from either or both of two opposing carrier sides.

A variety of carrier/circuit board arrangements is possible. Considering that the carrier is placed into a chamber, such chamber may be said to have an axis along which the carrier is inserted and removed, i.e., an axis of carrier movement. In one arrangement, circuit boards are oriented along axes generally normal to such axis of movement and in another, along axes generally parallel to such axis of movement.

Because the chamber interior undergoes changes in temperature of well in excess of 100° F. during circuit board testing, the test instruments are located outside the chamber and at room ambient. But, of course, the boards under test must be connected to such instruments. Therefore, a preferred carrier also includes what is known as a "back plane," i.e., a multi-plug panel to which the mother boards are connected. When the carrier is fully positioned in the chamber, the carrier back plane plugs to a similar back plane on the rear chamber wall. Instruments are connected to the rear side of the chamber back plane and outside such wall.

More specifically, the carrier shelves are arranged in at least two groups and plural shelves in each group have a mother board extending between shelf interior edges. At least one mother board includes a connector cable and at least one mother board of a group is spaced from at least one mother board of the other group.

Such mother board spacing provides a "slot" at the interior of the frame whereby the connector cable may be extended through the slot to the back plane. Typically, many or all mother boards include a connector cable, the mother boards of a particular group are spaced from those of the other group and the slot extends along substantially the entirety of the frame height and width. Such slot provides space whereby all connector cables may be extended to the back plane.

Further details of the invention are set forth in the following detailed description and in the drawing.

DETAILED DESCRIPTION OF PREFERRED EMBODIMENTS

Figure 1:
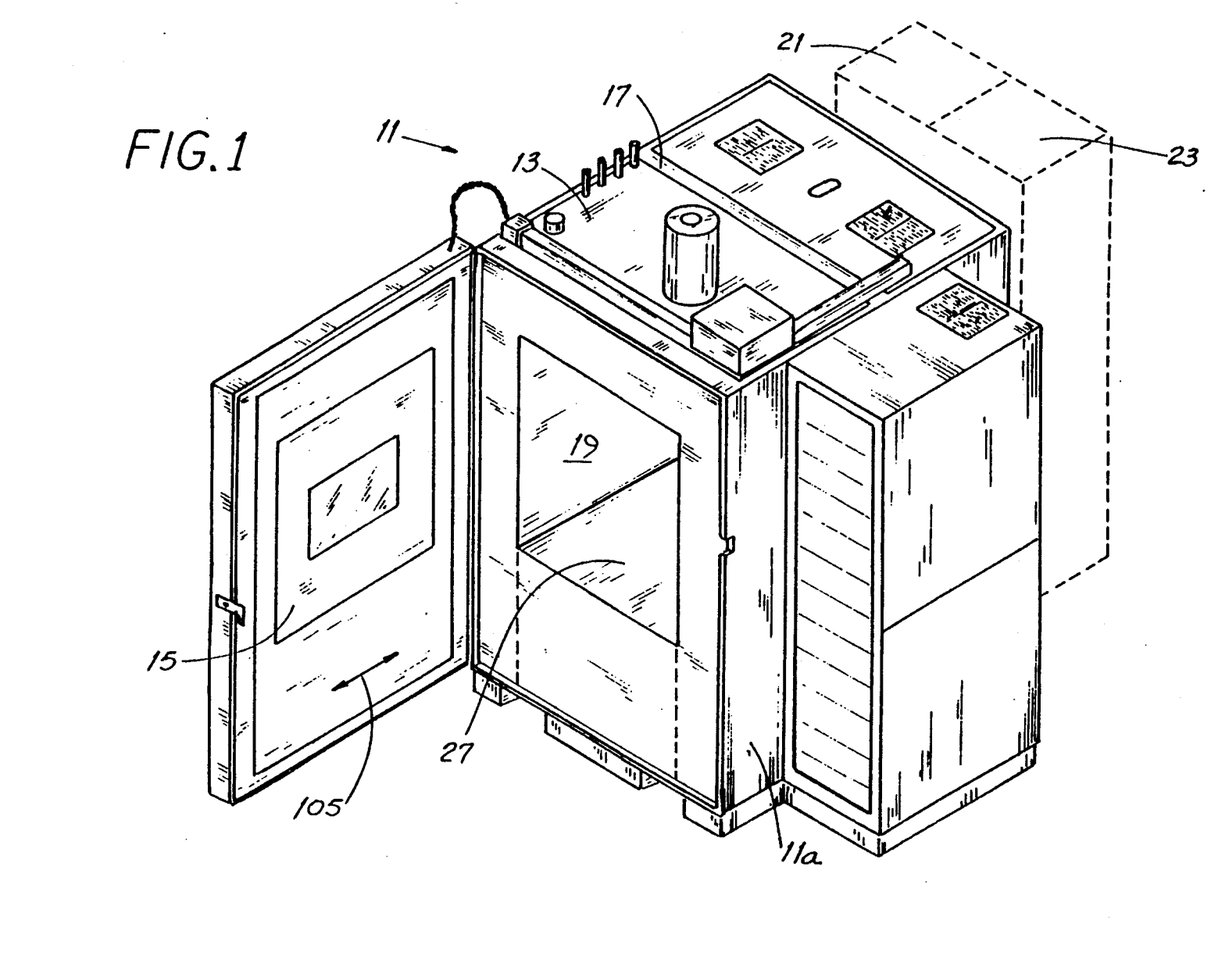
FIG. 1 is a perspective view of an environmental test chamber of a type with which the improved carrier is used. Portions are shown in dashed outline.
Figure 2:
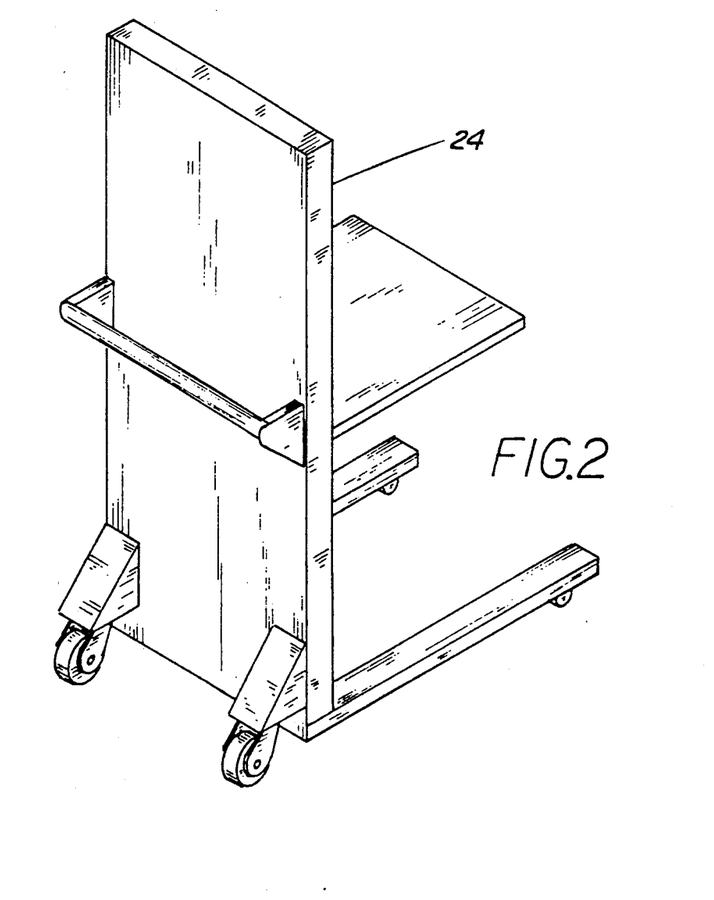
FIG. 2 is a perspective view of a cart used to insert a carrier into the cavity of a "raised floor" test chamber.
Figure 3:
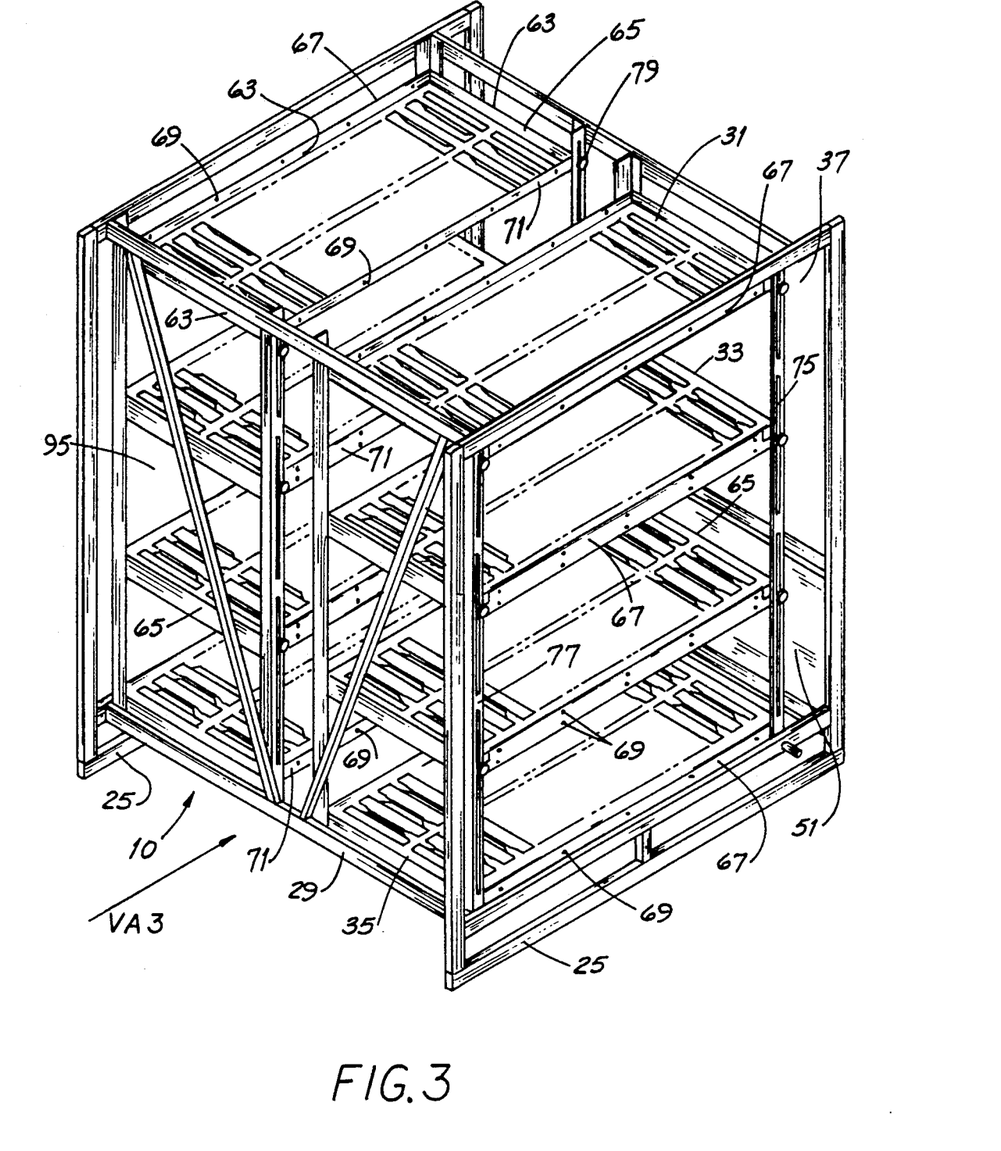
FIG. 3 is is a perspective view of the improved carrier with parts represented by dashed outline.

Referring to FIG. 1, understanding of the improved carrier will be aided by a brief explanation of an environmental test chamber 11. Such chamber 11 includes walls 11a, 17 a well insulated body 13, a front door 15 with a viewing port and heating and air conditioning units 21, 23, respectively, for rapidly changing the temperature within the chamber 11. The chamber 11 includes an interior cavity 19 to receive a carrier 10 loaded with circuit boards 20 to be tested. Such cavity 19 may have a raised floor 27 as illustrated and in such event, a cart 24 like that shown in FIG. 2 is used to place the carrier 10 in the chamber 11. In another configuration as represented in dashed outline, the cavity 19 extends to the bottom of the chamber 11. Referring additionally to FIG. 3, the carrier may include skids 25 or wheels (not shown) supporting the carrier 10 during movement into and out of the chamber 11 and during board testing.

In presenting the invention, details of the frame 29, the shelves 31, 33, 35 and the shelf retention mechanism 37 will be described in that order. Following those descriptions is an explanation how shelves 31, 33, 35 and mother boards 39 may be arranged for circuit board testing and how circuit boards 20 are connected to test instruments exterior of the chamber 11.

Figure 4:
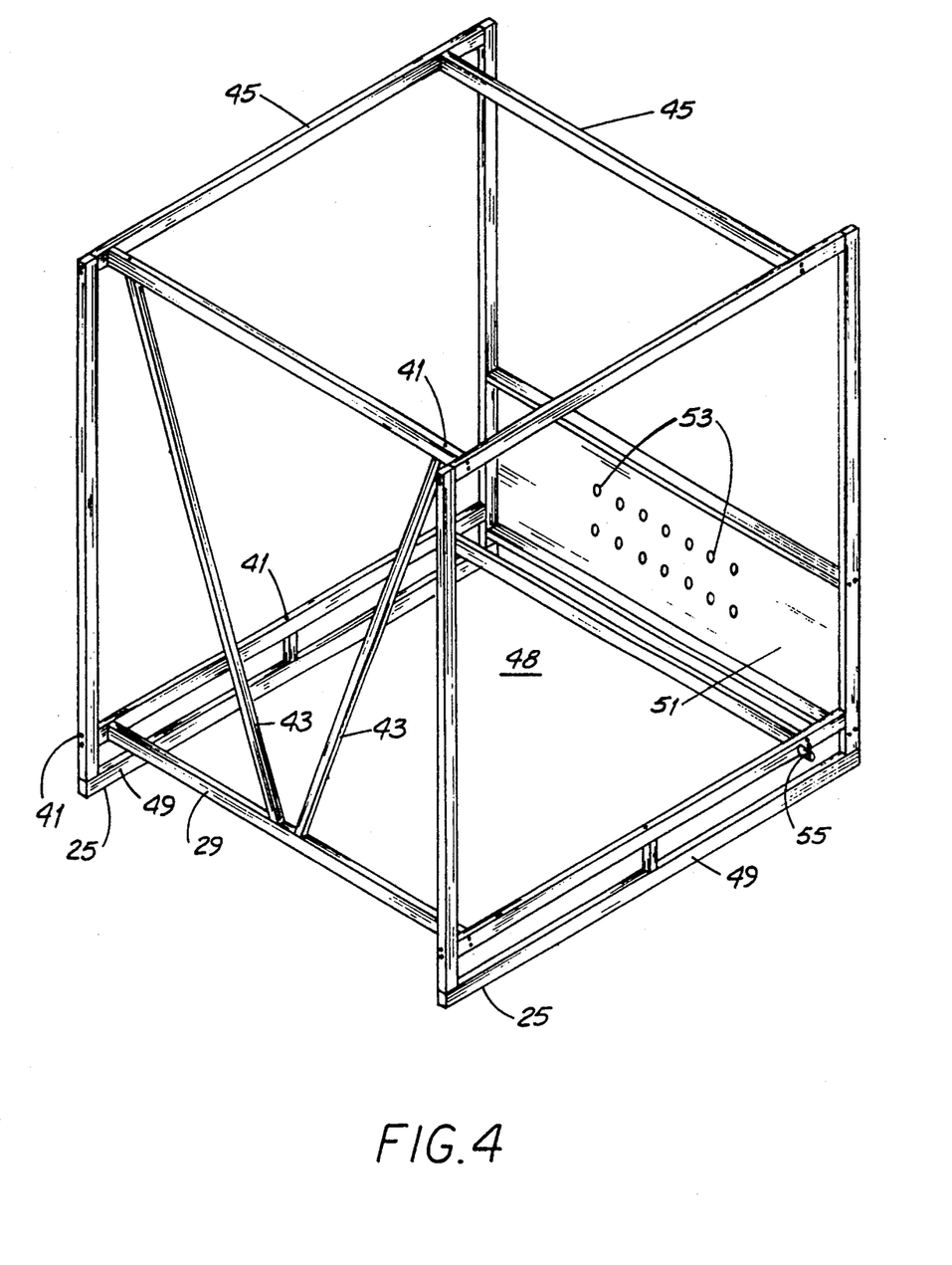
FIG. 4 is a perspective view of the frame of the carrier shown in FIG. 3.
Figure 12:
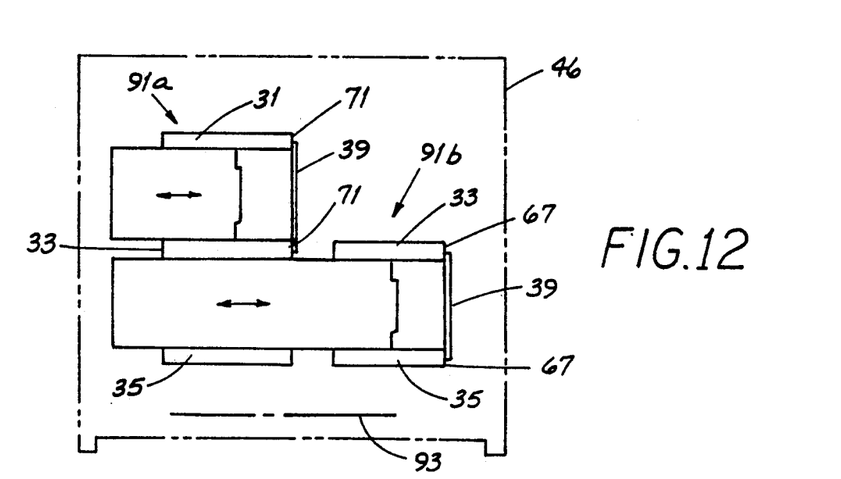

Referring to FIGS. 4 and 12, the improved carrier 10 includes a frame 29 constructed of aluminum bars secured to one another by bolts 41. Bolted construction permits easy disassembly, repair and/or re-configuration. And angled braces 43 add rigidity. Such frame 29 is aptly termed a perimeter frame 29 since all of its structural members are positioned at or closely adjacent to the outer boundaries 45 of the spatial "envelope" 46 defined by the frame 29. In other words, the frame 29 has an unobstructed, substantially open interior 48. In the illustrated frame configuration, a pair of parallel, spaced bottom rails 49 include skids 25 covered with a low friction material.

The frame 29 also includes a back plane 51, i.e., a multi-plug panel to which the mother boards 39 indirectly connected. Female plug sockets 53 are at the rear of the back plane 51 and when the carrier 10 is fully inserted in the chamber, such sockets 53 are electrically connected to male plug "prongs" on a similar back plane 47 located at the rear chamber wall 17. Such back plane connections are well known.

Figure 5:
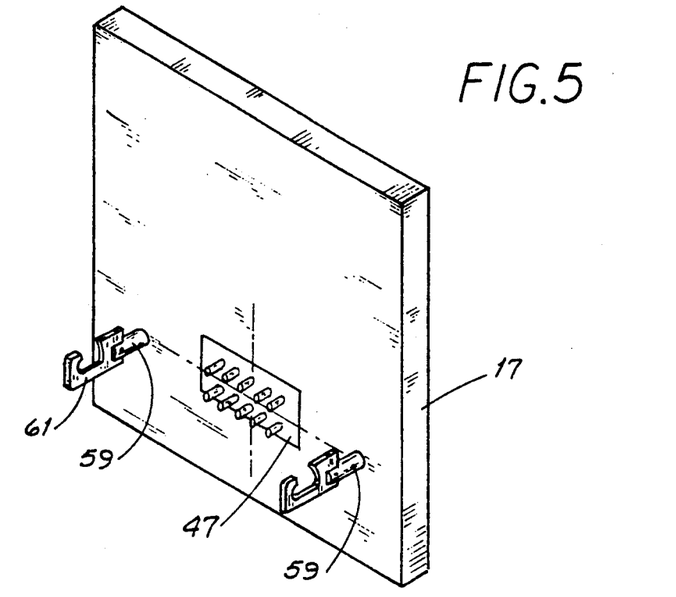
FIG. 5 is a perspective view of the back wall of a chamber equipped with an insertion/extraction device used to move the carrier into and out of the chamber.

Referring also to FIG. 5, the carrier 10 also includes a pair of laterally extending insertion/extraction pins 55, one on either side of the carrier 10. The chamber may be equipped with an automatic insertion/extraction device having hooks 61 mounted on extendable/retractable rods 59. When the carrier 10 is ready for loading into the chamber 11 (and assuming the cavity floor 27 is generally even with a shop floor), the device "reaches out," hooks the pins 55 and draws the carrier 10 into the chamber 11. At the completion of testing, the device extracts the carrier 10 from the chamber 11 by pushing it outward.

Figure 6:
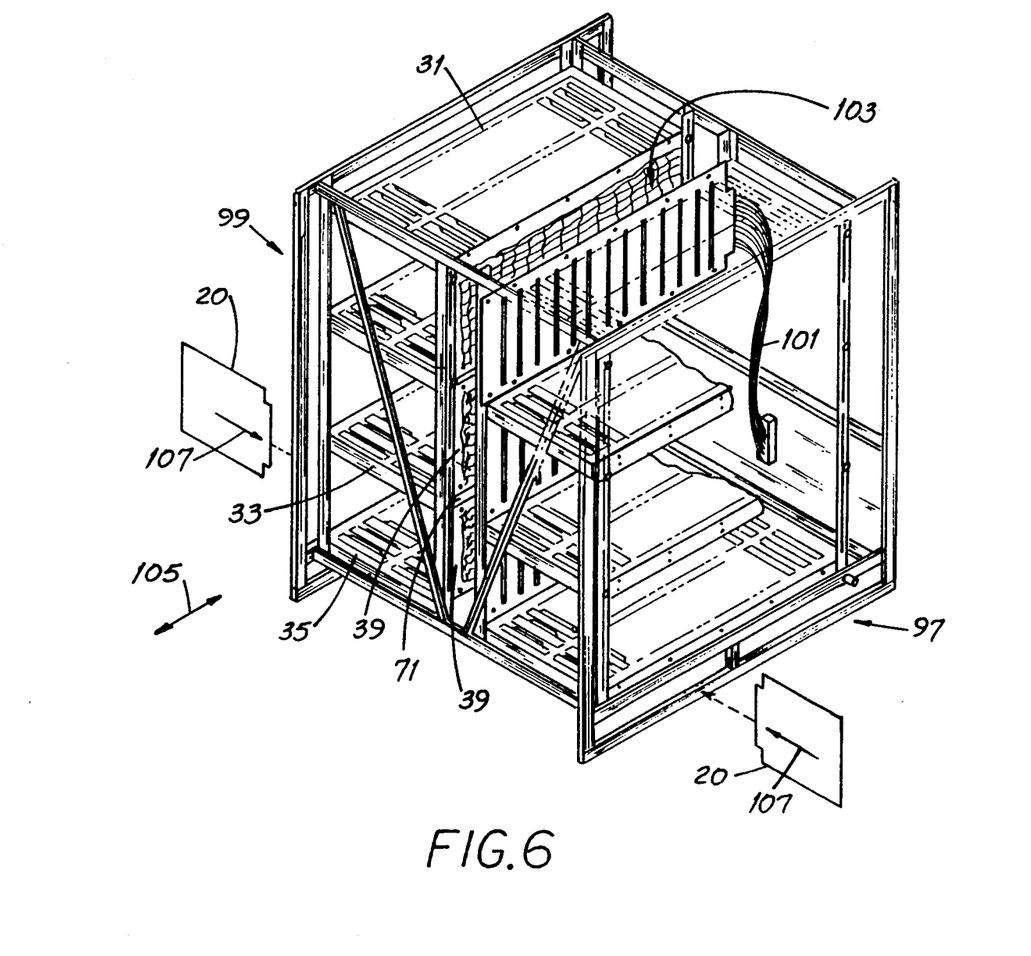
FIG. 6 is another perspective view of the improved carrier with mother boards mounted thereon and showing how circuit boards are inserted into the carrier. Parts are broken away and other parts are represented by dashed outline.

Referring next to FIGS. 3 and 6 the carrier shelves 31, 33, 35 will now be described. In a highly preferred embodiment, the improved carrier 10 includes a top shelf 31, a bottom shelf 35 and one or more intermediate shelves 33. Each top shelf 31 includes an upturned lip 63 extending along the end edges 65 and along the exterior edge 67. That portion of the lip 63 along the exterior edge 67 has several mounting holes 69 spaced generally equidistant from one another for mounting mother boards 39 as described in detail below. The interior edge 71 includes a lip 63 similarly having a plurality of spaced mounting holes 69 for mother board mounting.

The bottom shelves 35 are closely similar to the top shelves 31 but differ in the fact that all edges 65, 67, 71 are downturned. The interior and exterior edges 71, 67, respectively, also have a plurality of spaced mounting holes 69. Intermediate shelves 33 have edges 65, 67, 71 but differ from other shelves in that interior and exterior edges 71 and 67 each include two rows of horizontally arranged, spaced mounting holes 69. As will further be appreciated from the description below, an intermediate shelf 33 can have upwardly and/or downwardly extending mother boards 39 attached along an interior or exterior edge 71,67.

Certain types of shelves 31, 33, 35 share certain features. For example, the carrier 10 includes shelf retention mechanisms 37 of the pin and groove type located at all corners of each of the top and intermediate shelves 31, 33. Each pin 73 extends through one of several grooves 75 formed in one of the vertical support struts 77. A clamp knob 79 is tightened or released to retain or adjust shelf position. A mechanism 37 of the foregoing type is preferred since it permits a shelf 31, 33 to be positionally adjusted along a continuum rather than in discrete increments.

Figure 7:
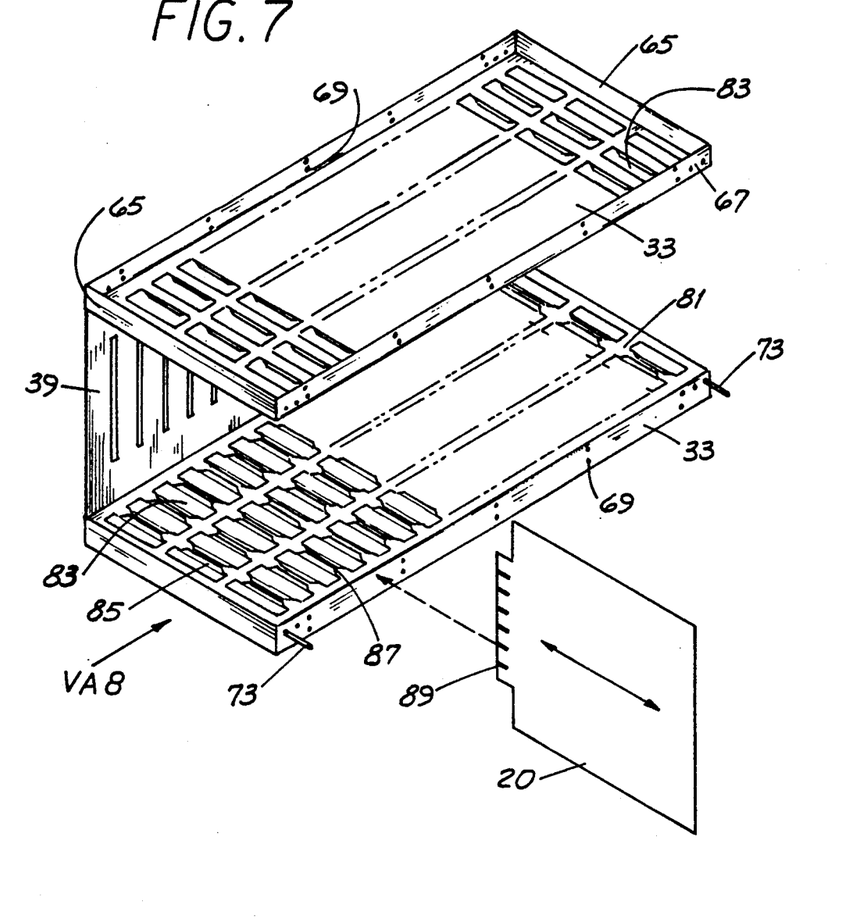
FIG. 7 is a perspective view showing carrier shelves in isolation but with a mother board attached and with a circuit board for insertion between shelves.
Figure 8:
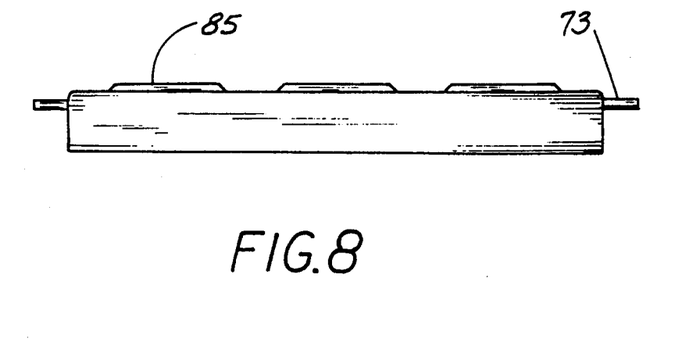
FIG. 8 is an end elevation view of one of the shelves of FIG. 7 taken generally along the viewing axis VA8 of FIG. 7.

Referring particularly to FIGS. 7 and 8 each shelf 31, 33, 35 includes a generally flat surface 81 through which are punched a number of generally rectangular openings 83. Such openings 83 are punched in a way that tangs 85 parallel to the end edges 65 of the shelves 31, 33, 35 are formed and slightly upturned. Further, upturned tangs 85 of side-by-side openings 83 are spaced slightly to define a notch 87 between them. In using the carrier 10, a circuit board 20 is inserted along aligned notches 87 in a manner further described below. The foregoing arrangement is preferred since it reduces the weight of each shelf 31, 33, 35 and therefore reduces the thermal load imposed on the heating and refrigeration units 21, 23. And air flow through the shelves 31, 33, 35 and along the surfaces of the circuit boards 20 is greatly enhanced so that the chamber air is at a relatively uniform temperature throughout and the temperature of the boards 20 under test closely "tracks" changing air temperature.

A circuit board 20 is retained in vertical orientation by a notch 87, by friction engagement with the shelf 31, 33 immediately above and, to a certain extent, by the plug connection 89 to the mother board 39 if a rigid (non-pigtail) connection is used.

FIG. 7 illustrates how a mother board 39 is mounted between the edges of adjacent shelves 33 for example. Such boards 39 have holes (not shown) in registry with the holes 69 along an edge 67, 71 and fasteners are used for mother board attachment. Mother boards 39 have a height generally corresponding to that of the boards 20 being tested.

The foregoing construction provides enormous flexibility in circuit board testing. Some examples of shelf and mother board arrangements made possible by such flexibility will now be described using simplified representative FIGS. 9-14. Such representative FIGURES portray positions of shelves and mother boards as generally viewed along viewing axis VA3 of FIG. 3.

Figure 9:
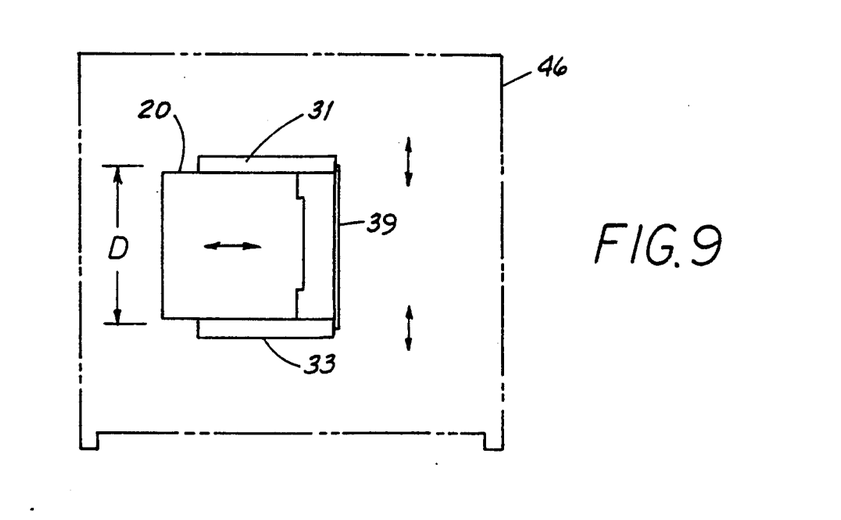
FIGS. 9-14 inclusive are simplified representative elevation views taken generally along viewing axis VA3 and showing differing arrangements of shelves and mother boards to accommodate circuit boards of differing sizes for test.

From the foregoing explanation and from FIG. 9, the frame-supported shelves 33 are spaced apart by a dimension "D". The position of at least one such shelf, e.g., intermediate shelf 33 is adjustable to select the dimension "D" for particular circuit boards 20. By adjustment of shelf spacing and number of shelves, the carrier 10 readily accommodates circuit boards 20 of differing sizes for test.

Figure 10:
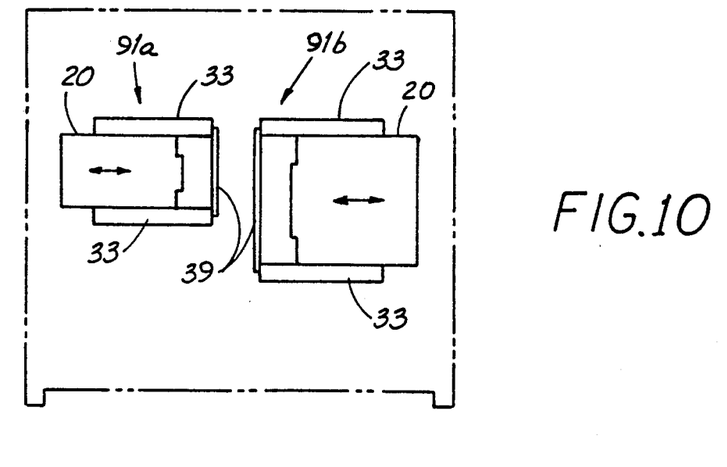

Referring next to FIG. 10, the shelves 33 in the carrier 10 are arranged in at least two groups 91a, 91b and the position of at least one shelf 33 in each group 91a, 91b is adjustable for dimension selection. That is, boards 20 of one size can be placed between the shelves 33 of group 91a while boards 20 of another size can be placed between the shelves 33 of group 91b. The carrier thereby simultaneously accommodates circuit boards 20 of differing sizes.

Figure 11:
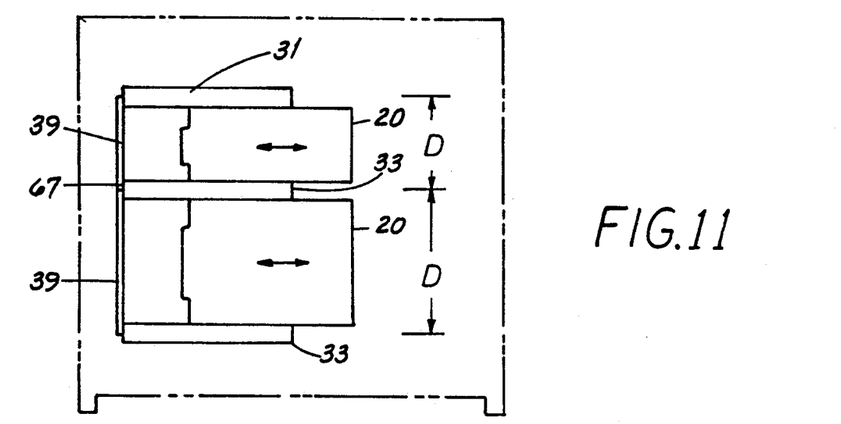

FIG. 11 shows at least three shelves 31, 33, any two of which are adjustable to select the dimension "D" between pairs of shelves 31, 33. Circuit boards 20 of differing sizes can be accommodated simultaneously in the carrier 10.

In FIG. 12, the carrier 10 includes shelves 31, 33, 35 arranged in at least two groups 91a, 91b, one group 91a of at least three shelves 31, 33, 35 and one of at least two shelves 33, 35. Separate mother boards 39 are mounted at differing positions with respect to a reference 93, e.g., a horizontal plane. One mother board 39 extends between the shelves 33, 35 of the two-shelf group 91b while another mother board 39 extends between two adjacent shelves 31, 33 of the three-shelf group 91a. And such mother boards 39 are mounted upon differing shelf edges such as interior and exterior edges 71, 67. This illustrates another way in which the carrier 10 simultaneously accommodates circuit boards 20 of differing sizes. It is also to be appreciated that FIG. 12 shows a way in which the carrier 10 accommodates circuit boards 20 of differing length without shelf modification.

Figure 13:
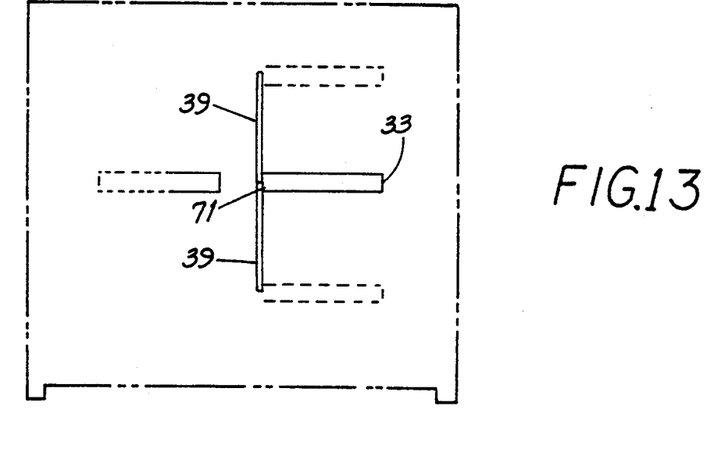

Referring to FIGS. 6, 11 and 13, at least one shelf 33 of the carrier 10 includes an edge 71 or 67 for releasably attaching a pair of oppositely extending mother boards 39. This feature minimizing the number of shelves required for mother board mounting.

Figure 14:
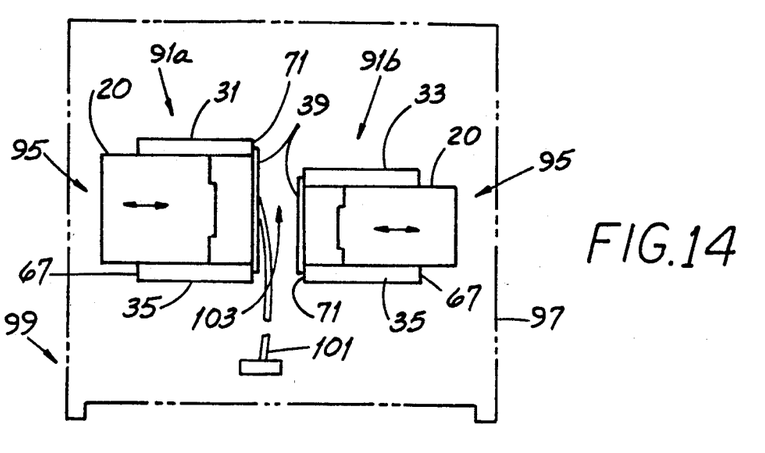

In FIG. 14, the shelves 31, 33 and/or 35 are arranged in two groups 91a, 91b, each having at least two shelves 31, 33, 35. Each shelf has an exterior edge 67 and an interior edge 71 attached to a mother board 39. The frame 29 and the exterior edges 67 of shelves 31, 33, 35 in a group 91a, 91b define an opening 95 whereby circuit boards 20 are inserted to and removed from either or both of two carrier sides 97, 99. The shelves in each group 91a, 91b have a mother board 39 extending between shelf interior edges and at least one mother board includes a connector cable 101. Further, at least one mother board 39 of a group 91a is spaced from that of the other group 91b to provide a slot 103 through which the cable 101 may be extended to the back plane 51. When all mother boards 39 of a group 91a are spaced from those of the other group 91a, the slot 103 extends along substantially the entirety of the frame height. All connector cables 101 may then be extended to the back plane 51.

Figure 15:
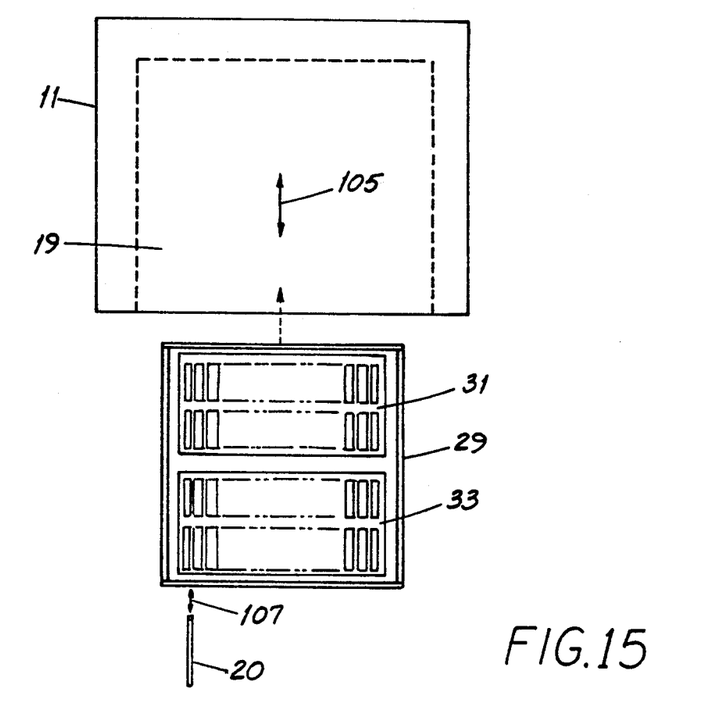
FIG. 15 is a simplified representative top plan view of a chamber and carrier showing an alternate carrier arrangement.
Figure 16:
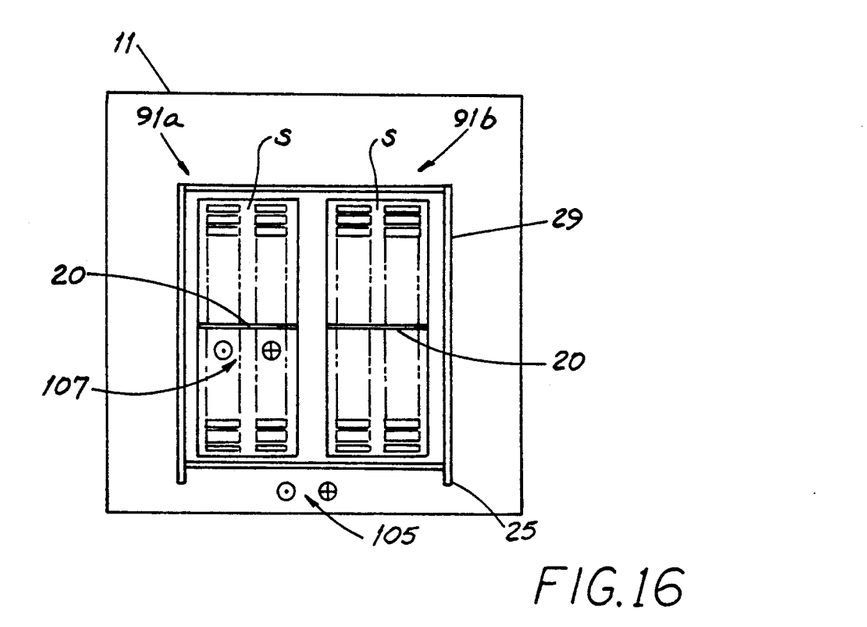
FIG. 16 is a simplified representative front elevation view of a chamber and carrier showing another alternate carrier arrangement.

Referring to FIGS. 1, 3 and 6, the chamber 11 has an axis of carrier 105 movement into and out of the chamber 11. In FIG. 3, such axis 105 is generally conincident with viewing axis VA3. In the arrangement of FIGS. 3 and 6, circuit boards 20 are oriented along axis 107 generally normal to such axis of movement 105. FIGS. 15 and 16 show carrier arrangements wherein circuit boards 20 are oriented along axes 107 generally parallel to the axis of movement. In FIG. 15, the shelves 31, 33, 35 extend laterally across the width of the carrier 10 and the boards 20 are vertical. The arrangement of FIG. 16 shows shelves "S" oriented vertically and supporting horizontally oriented circuit boards 20. In the view of FIG. 16, it is to be appreciated that the representation of each shelf "S" is intended to illustrate at least two vertically oriented shelves "S" in each group 91a, 91b. The shelves "S" of each group 91a, 91b are spaced from one another and co-planar with a plane coninicident with or parallel to the drawing sheet. The conventional dot-X symbols respectively represent the axes into and out of the plane of the drawing sheet.

It is to be appreciated that the arrangement of FIGS. 3 and 6 is highly preferred in that it is consistent with the air-ducting and back plane arrangements of conventional chambers 11. The arrangements of FIGS. 15 and 16 may require modification of such ducting and backplane arrangements.

While the principles of this invention have been described in connection with specific embodiments, it should be understood clearly that these descriptions are made only by way of example and are not intended to limit the scope of the invention.

We claim

1. In a carrier used for testing circuit boards, each of which has a length and a width, the carrier having a frame and plural locations for mounting the circuit boards during test, the improvement wherein the carrier includes:

first and second groups of frame-supported shelves, each group including at least two shelves spaced from one another;

each of at least two shelves in at least the first group having a shelf edge for removably mounting a mother board thereon to accommodate a circuit board supported by one group or by both groups depending upon the board length;

the positions of at least two shelves in the first group being adjustable in a continuum on the frame to select the between-shelf spacing to accommodate circuit boards of differing height;

at least each of two shelves in each of both groups including a plurality of openings permitting air to circulate therethrough; and, at least one shelf has two surfaces;

each surface has tangs extending therefrom;

the tangs at one surface extend in an opposite direction from those at the other surface; and, a circuit board is tang-supported along each surface.

2. The carrier of claim 1 wherein each of both groups includes at least two shelves, each having a pair of parallel shelf edges, each edge having holes for removably mounting a mother board along the edge.

3. The improved carrier of claim 1 wherein:

one of the groups includes at least three shelves and a mother board extending between two adjacent shelves; and, the other group includes at least two shelves and a mother board extending therebetween, whereby the carrier simultaneously accommodates circuit boards of differing sizes.

4. The improved carrier of claim 1 including shelf retention mechanisms whereby the positions of at least two shelves in the first group and two shelves in the second group are each adjustable in a continuum.

5. The improved carrier of claim 4 wherein the retention mechanisms are of the pin-and-groove type and include a clamp knob to retain or adjust shelf position.

6. The improved carrier of claim 1 wherein at least one shelf edge has means for releasably attaching a pair of oppositely-extending mother boards thereto, thereby minimizing the number of shelves required for mother board mounting.

7. The improved carrier of claim 6 wherein the frame is a perimeter frame having a substantially open interior and the shelf edges are interior of the frame whereby circuit boards are readily inserted between shelves.

8. The improved carrier of claim 1 wherein each self in each group has an interior edge attached to a mother board and has an exterior edge, the frame and the exterior edges of two shelves in a group defining an opening whereby circuit boards are inserted to and removed from either or both of two carrier sides.

9. The improved carrier of claim 8 wherein such interior and exterior edges are generally parallel to one another and circuit boards are inserted to and removed from either or both of two opposing carrier sides.

10. The improved carrier of claim 9 wherein testing is in a chamber having an axis of carrier movement and circuit boards are oriented along axes generally normal to such axis of movement.

11. The improved carrier of claim 9 wherein testing is in a chamber having an axis of carrier movement and circuit boards are oriented along axes generally parallel to such axis of movement.

12. The improved carrier of claim 1 wherein each at least two of the shelves in each group includes interior and exterior shelf edges, each shelf edge being for releasably attaching a mother board thereto whereby the carrier accommodates circuit boards of differing length without shelf modification.

13. The improved carrier of claim 1 further including a back plane and wherein:

each of at least two shelves in each group has an interior edge with a mother board attached thereto;

at least one mother board includes a connector cable; and, the mother board associated with a group is spaced from the mother board associated with the other group to define a slot, whereby the connector cable may be extended to the back plane.

14. The improved carrier of claim 13 wherein the frame has a height, all mother boards include a connector cable, mother boards associated with a group are spaced from those associated with the other group and the slot extends along substantially the entirety of the frame height whereby all connector cables may be extended to the back plane.

15. The carrier of claim 4 in combination with a test chamber and wherein the carrier further includes supports bearing the weight of the carrier during movement of the carrier into and out of the chamber and while the carrier reposes in the chamber.

* * * * *